(12) United States Patent
Chun

(10) Patent No.: US 10,353,611 B2
(45) Date of Patent: Jul. 16, 2019

(54) DATA STORAGE DEVICE AND OPERATING METHOD THEREOF

(71) Applicant: SK hynix Inc., Gyeonggi-do (KR)

(72) Inventor: Dong Yeob Chun, Seoul (KR)

(73) Assignee: SK hynix Inc., Gyeonggi-do (KR)

(*) Notice: Subject to any disclaimer, the term of this patent is extended or adjusted under 35 U.S.C. 154(b) by 214 days.

(21) Appl. No.: 15/470,248

(22) Filed: Mar. 27, 2017

(65) Prior Publication Data

US 2018/0081582 A1   Mar. 22, 2018

(30) Foreign Application Priority Data

Sep. 21, 2016 (KR) .................. 10-2016-0120701

(51) Int. Cl.
| | |
|---|---|
| G06F 3/06 | (2006.01) |
| G06F 11/30 | (2006.01) |
| G06F 11/34 | (2006.01) |
| G06F 12/00 | (2006.01) |
| G11C 7/22 | (2006.01) |
| G06F 12/02 | (2006.01) |
| G11C 7/04 | (2006.01) |
| G11C 29/02 | (2006.01) |

(52) U.S. Cl.
CPC .......... G06F 3/0632 (2013.01); G06F 3/0604 (2013.01); G06F 3/0679 (2013.01); G06F 11/3034 (2013.01); G06F 11/3058 (2013.01); G06F 11/3495 (2013.01); G06F 12/00 (2013.01); G06F 12/0246 (2013.01); G11C 7/04 (2013.01); G11C 7/22 (2013.01); G11C 29/021 (2013.01); G11C 29/028 (2013.01); G06F 2212/1032 (2013.01); G06F 2212/7202 (2013.01); G06F 2212/7209 (2013.01)

(58) Field of Classification Search
CPC .... G06F 3/0632; G06F 3/0604; G06F 3/0679; G06F 11/3034; G06F 11/6058; G06F 11/3495; G06F 12/00; G06F 12/0246; G06F 2212/1032; G06F 2212/7202; G06F 2212/7209; G11C 7/22
See application file for complete search history.

(56) References Cited

U.S. PATENT DOCUMENTS

| | | | | |
|---|---|---|---|---|
| 8,278,967 B2 * | 10/2012 | Chung | ............. | H03K 19/00384 326/30 |
| 8,769,190 B1 * | 7/2014 | Syu | ......... | G06F 3/061 711/103 |
| 9,275,706 B2 * | 3/2016 | Tam | ....... | G11C 7/222 |

(Continued)

*Primary Examiner* — Ramon A. Mercado
(74) *Attorney, Agent, or Firm* — IP & T Group LLP

(57) ABSTRACT

A data storage device includes a nonvolatile memory device; a control unit suitable for generating a descriptor in which works for controlling the nonvolatile memory device are described; a memory control unit suitable for performing a control operation for the nonvolatile memory device and a data input operation, based on the descriptor; and a calibrator suitable for performing a calibration operation for a signal to be provided to the nonvolatile memory device, in response to an enable signal provided from the memory control unit, wherein the memory control unit controls the calibrator such that the control operation for the nonvolatile memory device and the calibration operation of the calibrator are performed in parallel.

19 Claims, 10 Drawing Sheets

(56) References Cited

U.S. PATENT DOCUMENTS

2010/0198998 A1\* 8/2010 Hiramoto .............. G06F 13/124
 710/23
2013/0212319 A1\* 8/2013 Hida ................... G06F 12/0246
 711/103

\* cited by examiner

DATA STORAGE DEVICE AND OPERATING METHOD THEREOF

CROSS-REFERENCES TO RELATED APPLICATION

The present application claims priority under 35 U.S.C. § 119(a) to Korean application number 10-2016-0120701, filed on Sep. 21, 2016, in the Korean Intellectual Property Office, which is incorporated herein by reference in its entirety.

BACKGROUND

1. Technical Field

Various embodiments generally relate to a data storage device which uses a nonvolatile memory device as a storage medium.

2. Related Art

Recently, the paradigm for the computer environment has been converted into ubiquitous computing so that computer systems can be used anytime and anywhere. Due to this, use of portable electronic devices such mobile phones, digital cameras, and notebook computers has rapidly increased. In general, a portable electronic device may use a data storage device having a memory device for storing data to be used in the portable electronic device.

A data storage device using a memory device provides advantages in that, since there is no mechanical driving part, stability and durability are excellent, information access speed is high and power consumption is small. Examples of data storage devices having such advantages include a universal serial bus (USB) memory device, memory cards having various interfaces, a universal flash storage (UFS) device, and a solid state drive (SSD).

SUMMARY

Various embodiments of the present invention are directed to a data storage device capable of shortening the time required to perform a calibration operation for a signal, and an operating method thereof.

In an embodiment, a data storage device may include: a nonvolatile memory device; a control unit suitable for generating a descriptor describing one or more works for controlling the nonvolatile memory device; a memory control unit suitable for performing a control operation and a data input operation for the nonvolatile memory device, based on the descriptor; and a calibrator suitable for performing a calibration operation for a signal to be provided to the nonvolatile memory device in response to an enable signal provided from the memory control unit, wherein the memory control unit controls the calibrator so that the control operation and the calibration operation are performed in parallel.

In an embodiment, a method for performing a write operation of a data storage device including a nonvolatile memory device and a controller for controlling the nonvolatile memory device may include: performing in parallel a control operation for controlling the nonvolatile memory device to perform the write operation and a calibration operation for a data signal to be provided to the nonvolatile memory device; and applying a calibration value calculated as a result of the calibration operation to the data signal, and providing the data signal, to which the calibration value is applied, to the nonvolatile memory device.

According to the embodiments, the data storage device may shorten a time required to perform a calibration operation for a signal.

BRIEF DESCRIPTION OF THE DRAWINGS

The above and other features and advantages of the present is invention ill become more apparent to those skilled in the art to which the present invention belongs by describing in detail various embodiments thereof with reference to the attached drawings in which.

DETAILED DESCRIPTION

Figure 1:
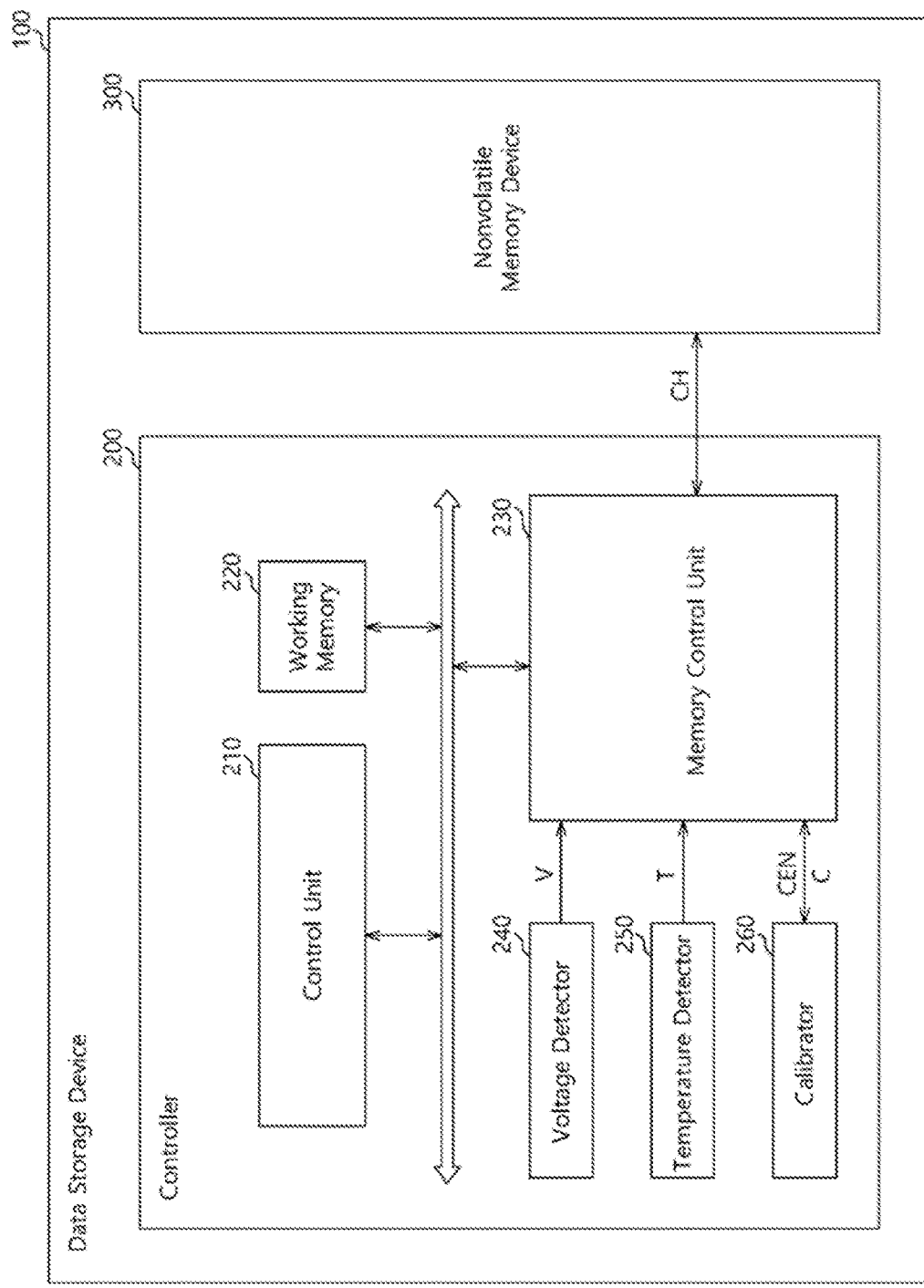
FIG. 1 is a block diagram illustrating a data storage device in accordance with an embodiment of the present invention.

In the present invention, advantages, features and methods for achieving them will become more apparent after a reading of the following exemplary embodiments taken in conjunction with the drawings. The present invention may, however, be embodied in different forms and should not be construed as being limited to the embodiments set forth herein. Rather, these embodiments are provided to describe the present invention in sufficient detail to the extent that a person skilled in the art to which the invention pertains can practice the present invention.

It is to be understood herein that embodiments of the present invention are not limited to the particulars shown in the drawings and that the drawings are not necessarily to scale and in some instances proportions may have been exaggerated in order to more clearly depict certain features of the invention. While particular terminology is used herein, it is to be appreciated that the terminology used herein is for the purpose of describing particular embodiments only and is not intended to limit the scope of the present invention.

As used herein, the term "and/or" includes any and all combinations of one or more of the associated listed items.

It will be understood that when an element is referred to as being "on," "connected to" or "coupled to" another element, it may be directly on, connected or coupled to the other element or intervening elements may be present. As used herein, a singular form is intended to include plural forms as well, unless the context clearly indicates otherwise. It will be further understood that the terms "includes," "comprises," "including," and "comprising" when used in this specification, specify the presence of at least one stated feature, step, operation, and/or element, but do not preclude the presence or addition of one or more other features, steps, operations, and/or elements thereof.

It is further noted that in the following description, specific details are set forth for facilitating the understanding of the present invention, however, the present invention may be practiced without some of these specific details. Also, it is noted, that well-known structures and/or processes may have only been described briefly or not described at all to avoid obscuring the present disclosure with unnecessary well known details.

It is also noted, that in some instances, s would be apparent to those skilled in the relevant art, an element (also referred to as a feature) described in connection with one embodiment may be used singly or in combination with other elements of another embodiment, unless specifically indicated otherwise.

Hereinafter a data storage device and an operating method thereof will be described below with reference to the accompanying drawings through various examples of embodiments.

FIG. 1 is a block diagram illustrating a data storage device 100 in accordance with an embodiment of the present invention. The data storage device 100 may store data to be accessed by a host device (not shown) such as a mobile phone, an MP3 player, a laptop computer, a desktop computer, a game player, a TV, an in-vehicle infotainment system, and so forth. The data storage device 100 may also be referred to as a memory system.

The data storage device 100 may be configured as any one of various data storage devices according to the protocol of an interface which is electrically coupled with the host device. For example, the data storage device 100 may be configured as a solid state drive, a multimedia card in the form of an MMC, an eMMC, an RS-MMC and a micro-MMC, a secure digital card in the form of an SD, a mini-SD and a micro-SD, a universal serial bus (USB) storage device, a universal flash storage (UFS) device, a personal computer memory card international association (PCMCIA) card type storage device, a peripheral component interconnection (PCI) card type storage device, a PCI express (PCI-E) card type storage device, a compact flash (CF) card, a smart media card, a memory stick, and the like.

The data storage device 100 may be manufactured as any one among various packages such as, for example, a package-on-package (PoP), a system-in-package (SIP), a system-on-chip (SoC), a multi-chip package (MCP), a chip-on-board (CoB), a wafer-level fabricated package (WFP) and a wafer-level stack package (WSP).

The data storage device 100 may include a controller 200 and a nonvolatile memory device 300.

The controller 200 may include a control unit 210, a working memory 220, a memory control unit 230, a voltage detector 240, a temperature detector 250, and a calibrator 260.

The control unit 210 may control one or more operations of the controller 200. The control unit 210 may drive an instruction or an algorithm of a code type, that is, a software, which is loaded in the working memory 220, and may control the one or more operations of one or more internal function blocks of the controller 200. The control unit 210 may be a micro control unit (MCU) or a central processing unit (CPU).

The working memory 220 may store a software to be driven by the control unit 210. Also, the working memory 220 may store data needed to drive the software. The working memory 220 may be a random access memory such as a dynamic random access memory (DRAM) or a static random access memory (SRAM).

The memory control unit 230 may control the nonvolatile memory device 300 based on a descriptor generated by the control unit 210. The descriptor will be described below in detail with reference to FIG. 2. The memory control unit 230 may also be referred to as a memory interface unit. The memory control unit 230 may provide an interface between the controller 200 and the nonvolatile memory device 300.

For example, the memory control unit 230 may provide one or more control signals to the nonvolatile memory device 300 based on a descriptor received form the control unit. The one or more control signals may include a command, an address, and so forth for controlling the nonvolatile memory device 300. The memory control unit 230 may also transmit the data, which may be stored temporarily in a data buffer memory of the controller (not shown), to the nonvolatile memory device 300 based on the descriptor. A command, an address and data may be provided in the form of signals.

The voltage detector 240 may detect the operation voltage of at least one of the control unit 210, the memory control unit 230 and the nonvolatile memory device 300. The voltage detector 240 may provide a detected voltage V to the memory control unit 230.

The temperature detector 250 may detect the temperature of the data storage device 100. The temperature detector 250 may provide a detected temperature T to the memory control unit 230. The temperature detector 250 may include a temperature sensor.

The calibrator 260 may perform a calibration operation for a signal in response to a calibration enable signal CEN provided from the memory control unit 230. For example, the calibrator 260 may perform a calibration operation for a data signal to be provided to the nonvolatile memory device 300 in response to a calibration enable signal CEN provided from the memory control unit 230.

The calibration operation may include the calibrator 260 generating a calibration value C per every single enablement of the calibration enable signal CEN. For example, a previous calibration value Cpre may be generated in response to the calibration enable signal CEN enabled in a previous write operation, and a current calibration value Ccur may be generated in response to the calibration enable signal CEN enabled in a current write operation.

The calibrator 260 may transmit the calibration value C to the memory control unit 230. The calibration value C may be employed for calibrating the voltage level, timing and so forth of a signal to be provided to the nonvolatile memory device 300.

The memory control unit 230 may further perform a calibration determination operation by determining whether or not the calibrator 260 performs the calibration operation for a signal to be provided to the nonvolatile memory device 300. In case that the calibrator 260 is determined to perform the calibration operation, the memory control unit 230 may further perform a calibration application operation by determining whether to apply the calibration value C to a signal to be provided to the nonvolatile memory device 300. The operation of the memory control unit 230 will be described with reference to FIGS. 3 to 5.

The nonvolatile memory device 300 may operate as the storage medium of the data, storage device 100. The nonvolatile memory device 300 may be configured by any one of various types of nonvolatile memory devices such as a NAND flash memory device, a NOR flash memory device, a ferroelectric random access memory (FRAM) using a ferroelectric capacitor, a magnetic random access memory (MRAM) using a tunneling magneto-resistive (TMR) layer, a phase change random access memory (PCRAM) using a chalcogenide alloy, and a resistive random access memory (RERAM) using a transition metal oxide. The ferroelectric random access memory (FRAM), the magnetic random access memory (MRAM), the phase change random access memory (PCRAM) and the resistive random access memory (RERAM) are a kind of nonvolatile random access memory devices capable of random access to memory cells. The nonvolatile memory device 300 may be configured by a combination of a NAND flash memory device and the above-described various types of nonvolatile random access memory devices.

The nonvolatile memory device 300 may be coupled with the controller 200 through a channel CH. The channel CH may be one or more signal lines capable of transmitting a command, an address, control signals and data.

Figure 2:
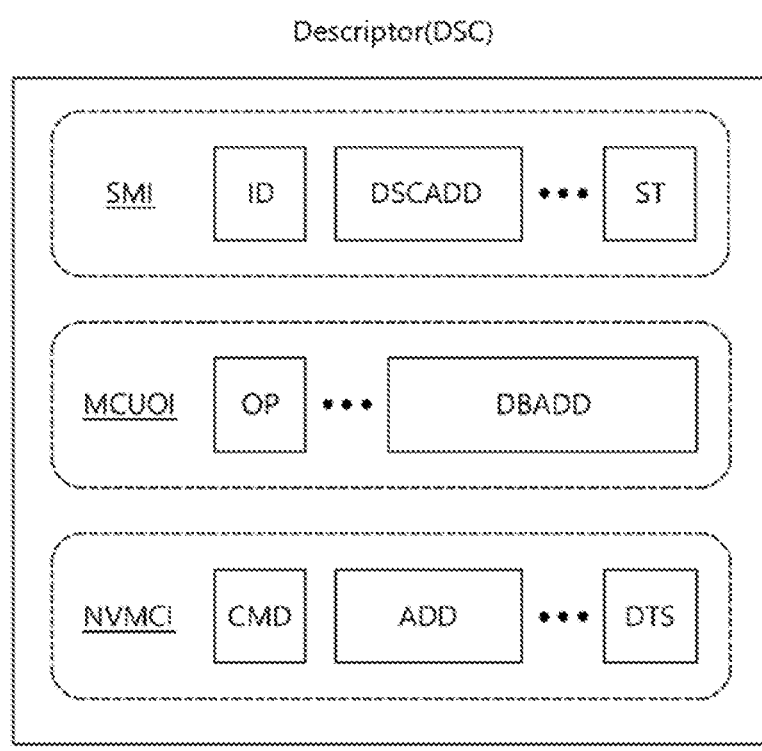
FIG. 2 is a diagram to assist in the explanation of a descriptor which is generated by a control unit of FIG. 1.

FIG. 2 is a diagram to assist in the explanation of a descriptor DSC which is generated by the control unit 210 in accordance with an embodiment of the present invention.

The descriptor DSC may be a work order describing one or more works to be processed by the memory control unit 230 in order to control the nonvolatile memory device 300. The descriptor DSC may be generated by the control unit 210, and may be decoded and executed by the memory control unit 230. The descriptor DSC may include a software management information SMI which is managed by the control unit 210 or a software driven by the control unit 210, a memory control unit operation information MCUOI for the operation of the memory control unit 230, and a nonvolatile memory device control information NVMCI for the memory control unit 230 to control the nonvolatile memory device 300.

The software management information SMI may include a descriptor identifier ID for the descriptor DSC and an address DSCADD representing storage location of the descriptor DSC in the working memory 220. Also, the software management information SMI may include a state information ST of the nonvolatile memory device 300 to be reported to the control unit 210 as a result of processing the descriptor DSC. By referring to the state information ST, the control unit 210 may perform follow-up measures (e.g., an error handling operation) for the operation of the nonvolatile memory device 300 performed according to the descriptor DSC.

The memory control unit operation information MCUOI may include an operation information OP indicating an operation (for example, a read or write operation) to be performed by the nonvolatile memory device 300. The memory control unit operation information MCUOI may further include an address DBADD which may represent a storage location in a data buffer memory (not shown) of the controller 200 for data to be stored in the nonvolatile memory device 300. The address DBADD, in a read operation, may represent a storage location in the data buffer memory (not shown) of the controller 200 for data which are read from the nonvolatile memory device 300. The data which are stored in the data buffer memory of the controller may then be transferred to a host device or to the nonvolatile memory device in a read or write operation, respectively.

The nonvolatile memory device control information NVMCI may include a command CMD and an address ADD to be provided to the nonvolatile memory device 300, and a data size information DTS indicating the size of data to be stored in the nonvolatile memory device 300 or the size of data to be read from the nonvolatile memory device 300.

Figure 3:
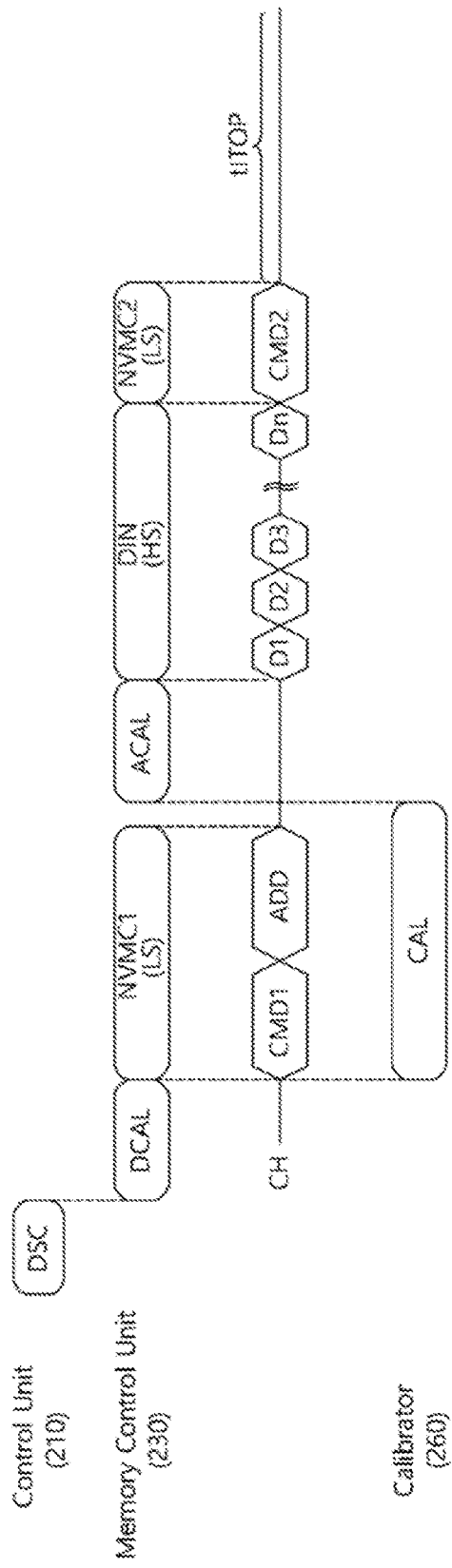
FIG. 3 is a timing diagram to assist in the explanation of the operations of the data storage device of FIG. 1.

FIG. 3 is a timing diagram to assist in the explanation of the operations of the internal function blocks of the data storage device 100. FIG. 3 exemplifies an operation of the memory control unit 230 for controlling a write operation of the nonvolatile memory device 300 based on a descriptor DSC received from the control unit 210

Accordingly, the control unit 210 may generate a relevant descriptor DSC for the nonvolatile memory device 300 to store data therein, and provide the generated descriptor DSC to the memory control unit 230.

Upon receipt of the descriptor DSC, the memory control unit 230 performs a calibration determination operation DCAL. Through the calibration determination operation DCAL, the memory control unit 230 may determine whether a calibration operation is needed or not.

Figure 4:
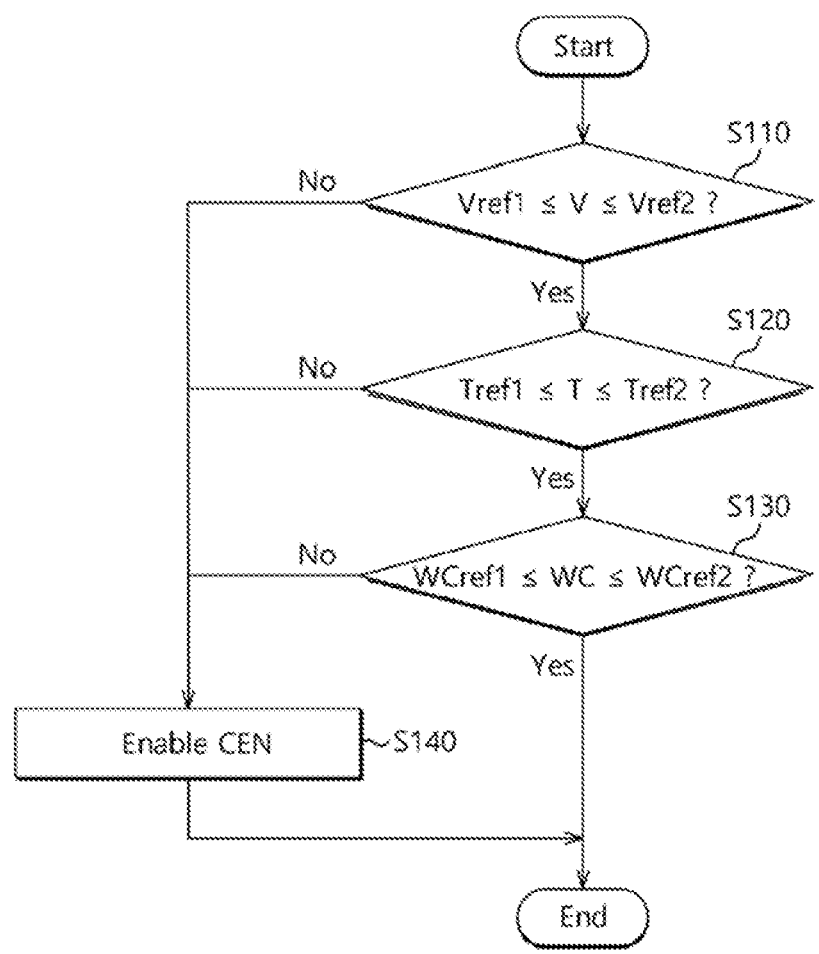
FIG. 4 is a flow chart to assist in the explanation of a calibration determining operation of a memory control unit of FIG. 1.

FIG. 4 is a flow chart to assist in the explanation of the calibration determining operation DCAL.

Referring to FIG. 4, the memory control unit 230 may perform the calibration determination operation DEAL based on the voltage V provided from the voltage detector 240, the temperature T provided from the temperature detector 250 and a write count WC.

At step S110, the memory control unit 230 may determine whether the voltage V falls within an allowable voltage range between first and second reference voltages Vref1 and Vref2.

In the case where the voltage V is determined to have a value out of the allowable voltage range, the memory control unit 230 determines that the calibration operation for a signal is needed due to the voltage V being out of the allowable voltage range. Therefore, the memory control unit 230 enables the calibration enable signal CEN at step S140 and ends the calibration determination operation DCAL.

In the case where the voltage V is determined to be within the allowable voltage range at step S110, the memory control unit 230 then determines whether the temperature T falls in an allowable temperature range between first and second reference temperatures Tref1 and Tref2 at step S120.

In the case where the temperature T is determined to go out of the allowable temperature range, the memory control unit 230 determines that the calibration operation for a signal is needed due to the temperature T out of the allowable temperature range. Therefore the memory control unit 230 then enables the calibration enable signal CEN at the step 140 and ends the calibration determination operation DCAL.

In the case where the temperature T is determined within the allowable temperature range at step S120, the memory control unit 230 may then determine whether a write count WC falls in an allowable count range between first and second reference counts WCref1 and WCref2. The write count WC may be the number of write operations performed in the nonvolatile memory device 300. The memory control unit 230 may manage the write count WC based on the operation information OP included in the memory control unit operation information MCUOI of the descriptor DSC.

In the case where the write count WC is determined to go out of the allowable count range, the memory control unit 230 determines that the calibration operation for a signal is needed due to the write count WC out of the allowable count range representing that it is time for the calibration operation according to a cyclic factor, that is, a calibration performance schedule. Therefore, the memory control unit 230 enables the calibration enable signal CEN at the step S140 and ends the calibration determination operation DCAL.

In the case where the write count WC is determined within the allowable count range at step S140, the memory control unit 230 does not enable the calibration enable signal CEN and ends the calibration determination operation DCAL.

As an example for illustrating the invention, it was explained above that the operations of determining if the voltage V, the temperature T and the write count WC satisfy certain determination conditions (that is, the step S110, the step S120 and the step S130) are performed sequentially. However, we note that in other embodiments, these operations of determining if the voltage V, the temperature T and the write count WC satisfy the conditions may be performed in parallel or in a different sequence than the one shown in FIG. 4. In yet another embodiment, only one or two of the operations of determining if the voltage V satisfies the condition, the operation of determining if the temperature T satisfies the condition and the operation of determining if the write count WC satisfies the condition may be performed either in parallel or in sequence. The order of the sequence may be varied by design.

Referring to FIG. 3, the memory control unit 230 may perform at a low speed LS a first nonvolatile memory device control operation NVMC1 of providing to the nonvolatile memory device 300 a first command CMD1 instructing a write operation and an address ADD of data to be stored in the nonvolatile memory device 300 since the first nonvolatile memory device control operation NVMC1 is less susceptible to a signal characteristic such as signal integrity. Conversely, the memory control unit 230 may perform at a high speed HS a data input operation DIN of providing the nonvolatile memory device 300 with data D1 to Dn since the data input operation DIN is susceptible to a signal characteristic such as signal integrity, In order to prevent the calibration operation CAL from affecting the write operation, the memory control unit 230 may control the calibrator 260 to perform the calibration operation CAL during the first nonvolatile memory device control operation NVMC1, and to complete the calibration operation CAL before the start of the data input operation DIN. In order to ensure that the first nonvolatile memory device control operation NVMC1 and the calibration operation CAL are performed in parallel, the memory control unit 230 provides the enabled calibration enable signal CEN to the calibrator 260 at the start of the first nonvolatile memory device control operation NVMC1.

When the calibration operation CAL is completed, the calibrator 260 may provide the calibration value C to the memory control unit 230. When the memory control unit receives the calibration value C, the memory control unit 230 may then perform the calibration application operation ACAL. Through the calibration application operation ACAL, the memory control unit 230 determines whether to apply the calibration value C to a signal (for example, a data signal) which is to be provided to the nonvolatile memory device 300.

Figure 5:
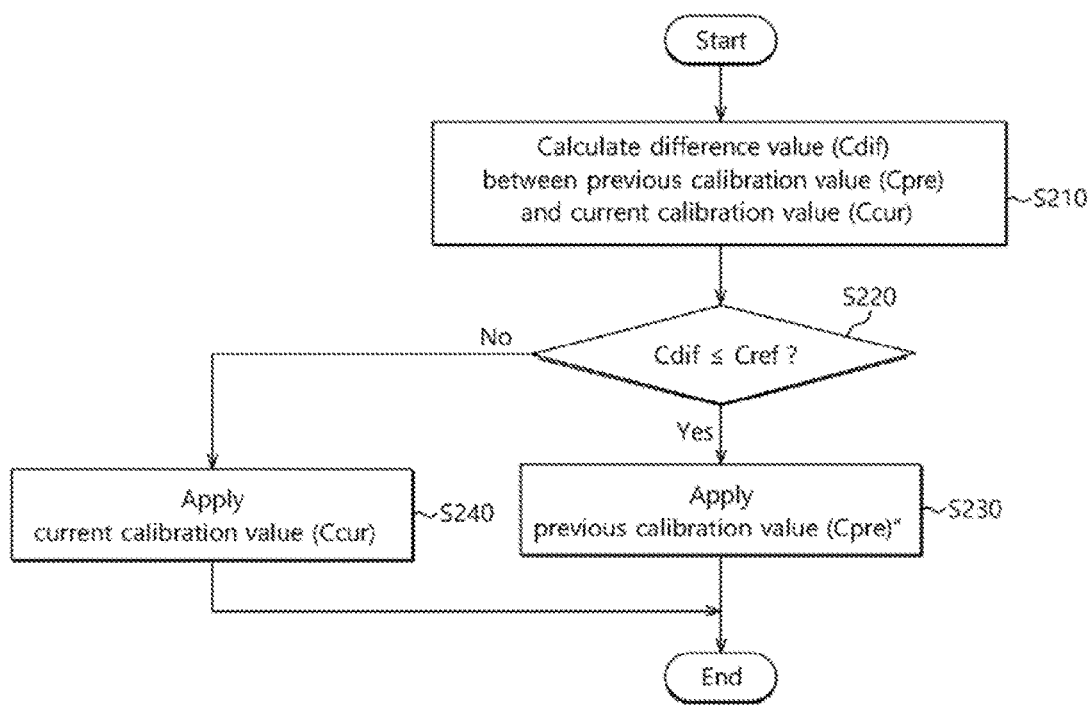
FIG. 5 is a flow chart to assist in the explanation of the calibration application operation of the memory control unit of FIG. 1.

FIG. 5 is a flow chart illustrating the calibration application operation ACAL.

Referring to FIG. 5, the memory control unit 230 may Perform the calibration application operation ACAL based on a previous calibration value Cpre and a current calibration value Ccur.

At step S210, the memory control unit 230 may calculate a difference value Cdif between the previous calibration value Cpre and the current calibration value Ccur. For instance, the difference value Cdif may be the absolute value of a difference between the previous calibration value Cpre and the current calibration value Ccur.

At step S220, the memory control unit 230 may determine whether the difference value Cdif is equal to or smaller than a calibration reference value Cref.

In the case where the difference value Cdif is determined as equal to or smaller than the calibration reference value Cref ("YES" at step S220), the memory control unit 230 may calibrate the data D1 to Dn by applying the previous calibration value Cpre at step S230 and end the calibration application operation ACAL. When the difference value Cdif is equal to or smaller than the calibration reference value Cref, the effect of applying the current calibration value Ccur would be small.

In the case where the difference value Cdif is determined as greater than the calibration reference value Cref ("NO" at step S220), the memory control unit 230 calibrates the data D1 to Dn by applying the current calibration value Ccur at step S240 and end the calibration application operation ACAL.

Referring back to FIG. 3, the memory control unit 230 may perform the data input operation DIN to the data D1 to Dn calibrated with one of the previous calibration value Cpre and the current calibration value Ccur by providing the calibrated data D1 to Dn to the nonvolatile memory device 300.

When the data input operation DIN is completed, the memory control unit 230 may perform a second nonvolatile memory device control operation NVMC2 of providing to the nonvolatile memory device 300 a second command CMD2 instructing an internal operation ITOP. Through the internal operation ITOP, the calibrated data D1 to Dn are actually stored in the memory cells of the nonvolatile memory device 300. As the case may be, the second nonvolatile memory device control operation NVMC2 may be omitted.

Figure 6:
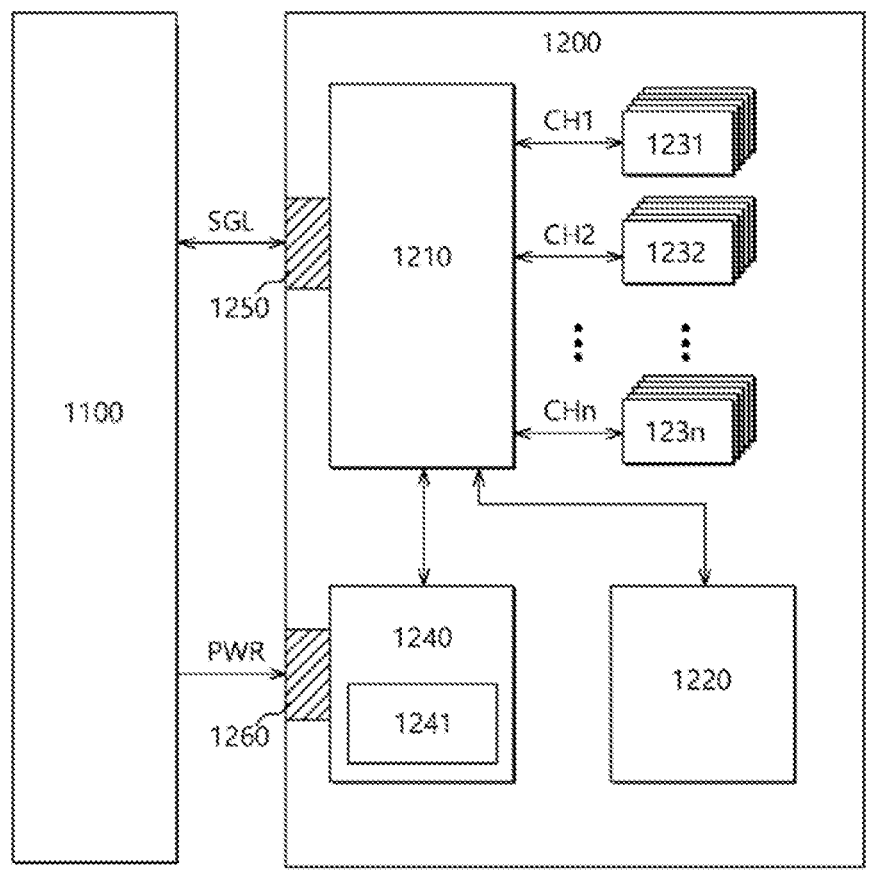
FIG. 6 is a diagram illustrating a data processing system including a solid state drive (SSD) in accordance with an embodiment of the present invention.

FIG. 6 is a diagram illustrating a data processing system 1000 including a solid state drive (SSD) 1200, in accordance with an embodiment of the present invention. Referring to FIG. 6, the solid state drive (SSD) 1200 may be coupled to a host device 1100.

The SSD 1200 may include a controller 1210, a buffer memory device 1220, nonvolatile memory devices 1231 to 123n, a power supply 1240, a signal connector 1250, and a power connector 1260.

The controller 1210 may control one or more operations of the SSD 1200.

The buffer memory device 1220 may temporarily store data to be stored in the nonvolatile memory devices 1231 to 123n. Further, the buffer memory device 1220 may temporarily store the data read out from the nonvolatile memory devices 1231 to 123n. The data temporarily stored in the buffer memory device 1220 may be transmitted to the host device 1100 or to the nonvolatile memory devices 1231 to 123n in a read or a write operation, respectively, according to control of the controller 1210.

The nonvolatile memory devices 1231 to 123n may be used as storage media of the SSD 1200. The nonvolatile memory devices 1231 to 123n may be coupled with the controller 1210 through a plurality of channels CH1 to CHn, respectively. One or more nonvolatile memory devices may be coupled to each of the channels CH1 to CHn. The nonvolatile memory devices coupled to each channel may be coupled to the same signal bus and data bus.

The power supply 1240 may provide power PWR inputted through the power connector 1260, to the SSD 1200. The power supply 1240 may include an auxiliary power supply 1241. The auxiliary power supply 1241 may supply power to allow the SSD 1200 to be normally terminated when a sudden power-off occurs. The auxiliary power supply 1241 may include large capacitance capacitors capable of charging power PWR.

The controller 1210 may exchange a signal SGL with the host device 1100 through the signal connector 1250. The signal SGL may include a command, an address, data, and so forth. The signal connector 1250 may be constructed by various types of well-known connectors depending on the interface scheme between the host device 1100 and the SSD 1200.

Figure 7:
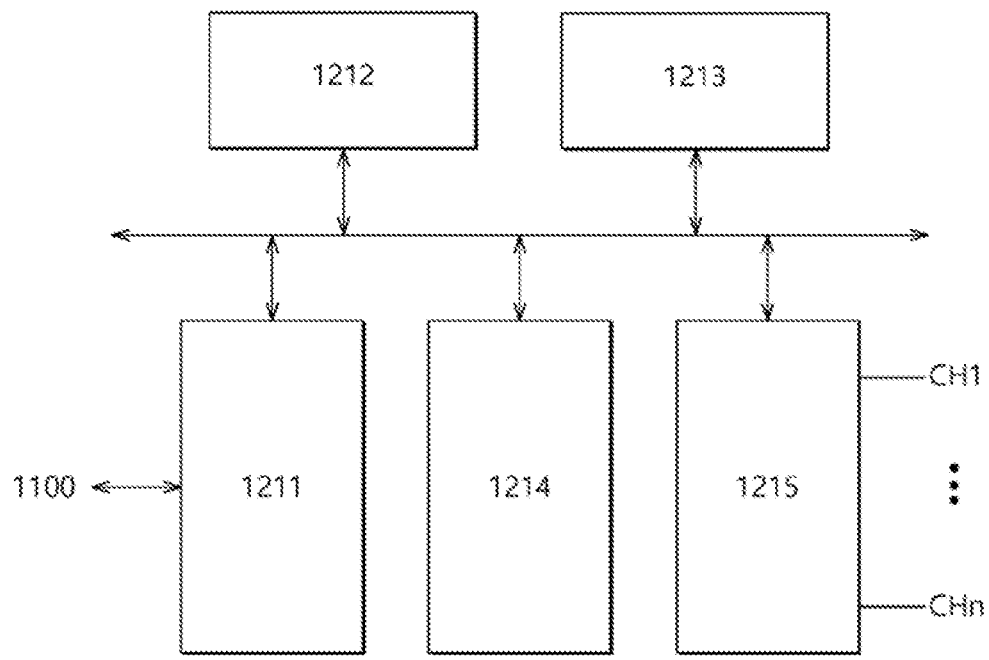
FIG. 7 is a diagram illustrating an example of the controller shown in FIG. 6.

FIG. 7 is a diagram illustrating an example of the controller 1210 of FIG. 6. Referring to FIG. 7, the controller 1210 may include a host interface unit 1211, a control unit 1212, a random access memory 1213, an error correction code (ECC) unit 1214, and a memory interface unit 1215.

The host interface unit 1211 may interface the host device 1100 and the SSD 1200 according to the protocol of the host device 1100. For example, the host interface unit 1211 may communicate with the host device 1100 through any one of secure digital, universal serial bus (USB), multimedia card (MMC), embedded MMC (eMMC), personal computer memory card international association (PCMCIA), parallel advanced technology attachment (PATA), serial advanced technology attachment (SATA), small computer system interface (SCSI), serial attached SCSI (SAS), peripheral component interconnection (PCI), PCI express (PCI-E) and universal flash storage (UFS) protocols. In addition, the host interface unit 1211 may perform a disk emulating function for supporting the host device 1100 to recognize the SSD 1200 as a general purpose data storage device, for example, a hard disk drive (HDD.

The control unit 1212 may analyze and process a signal SGL inputted from the host device 1100. The control unit 1212 may control operations of internal function blocks according to a firmware or a software for driving the SSD 1200. The random access memory 1213 may be used as a working memory for driving such a firmware or software.

The error correction code (ECC) unit 1214 may generate parity data of data to be transmitted to the nonvolatile memory devices 1231 to 123n. The generated parity data may be stored together with the data in the nonvolatile memory devices 1231 to 123n. The error correction code (ECC) unit 1214 may detect an error of the data read out from the nonvolatile memory devices 1231 to 123n, based on the parity data. If a detected error is within a correctable range, the error correction code (ECC) unit 1214 may correct the detected error. Any suitable error correction code (ECC) unit may be employed.

The memory interface unit 1215 may interface the controller with the nonvolatile memory devices 1231 to 123n. The memory interface unit 1215 may provide control signals such as commands and addresses to the nonvolatile memory devices 1231 to 123n, according to control of the control unit 1212. Moreover, the memory interface unit 1215 may exchange data with the nonvolatile memory devices 1231 to 123n, according to control of the control unit 1212. For example, the memory interface unit 1215 may provide the data stored in the buffer memory device 1220, to the nonvolatile memory devices 1231 to 123n, or provide the data read out from the nonvolatile memory devices 1231 to 123n, to the buffer memory device 1220. Any suitable memory interface may be employed.

Figure 8:
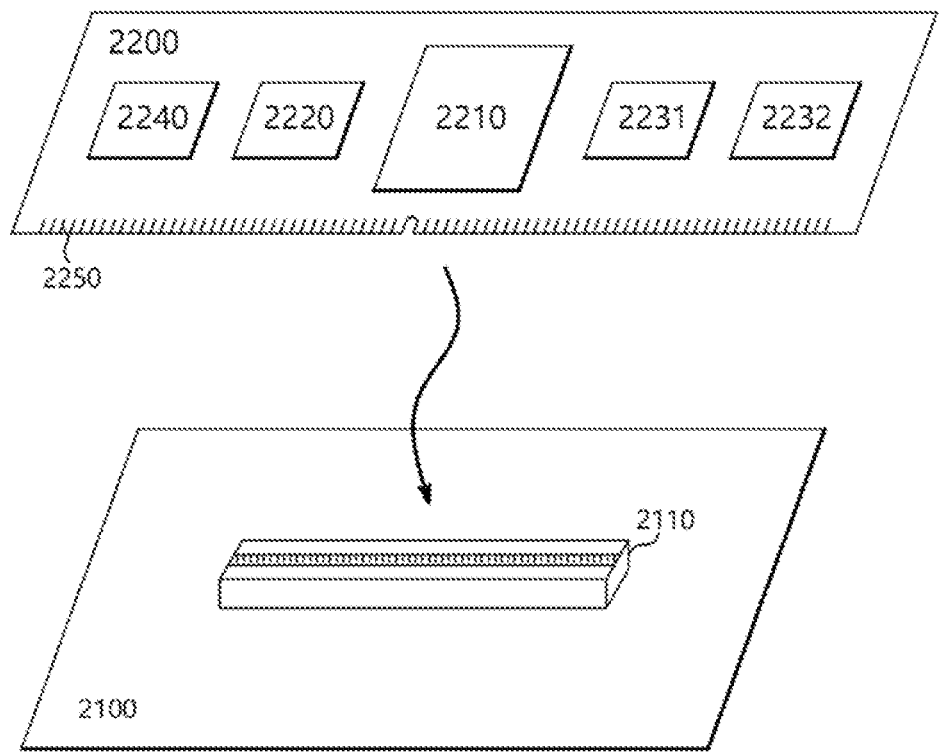
FIG. 8 is a diagram illustrating a data processing system including a data storage device in accordance with an embodiment of the present invention.

FIG. 8 is a diagram illustrating a data processing system 2000 which includes a data storage device 2200 in accordance with an embodiment of the present invention. The data storage device 2200 may be operatively mounted to a host device 2100.

The host device 2100 may be constructed in the form of a board such as a printed circuit board. Although not shown, the host device 2100 may include one or more internal function blocks for performing the functions of a host device.

The data storage device 2200 may be removably coupled to the host device 2100. The host device 2100 may include a connection terminal 2110 such as a socket, a slot or a connector adapted to removably receive a connection terminal 2250 of the data storage device 2200.

The data storage device 2200 may, be constructed in the form of a board such as a printed circuit board. The data storage device 2200 may be referred to as a memory module or a memory card. The data storage device 2200 may include a controller 2210, a buffer memory device 2220, one or more nonvolatile memory devices, e.g., nonvolatile memory devices 2231 and 2232, a power management integrated circuit (PMIC) 2240, and the connection terminal 2250.

The controller 2210 may control one or more operations of the data storage device 2200. The controller 2210 may be configured in the same manner as the controller 1210 shown in FIG. 6.

The buffer memory device 2220 may temporarily store data which are to be stored in the nonvolatile memory devices 2231 and 2232 in a write operation. Further, the buffer memory device 2220 may temporarily store the data read out from the nonvolatile memory devices 2231 and 2232 in a read operation. The data temporarily stored in the buffer memory device 2220 may be transmitted to the host device 2100 or the nonvolatile memory devices 2231 and 2232n a read or write operation, respectively, according to control of the controller 2210.

The nonvolatile memory devices 2231 and 2232 may be used as storage media of the data storage device 2200. Although, the embodiment of FIG. 8, shows two nonvolatile memory devices, it should be understood that, generally, one or more nonvolatile memory devices may be employed.

The PMIC 2240 may provide the power inputted through the connection terminal 2250, to the inside of the data storage device 2200. The PMIC 2240 may manage the power of the data storage device 2200 according to control of the controller 2210.

The connection terminal 2250 may be coupled to the connection terminal 2110 of the host device 2100. Through the connection terminal 2250, signals such as commands, addresses, data and so forth and power may be transferred between the host device 2100 and the data storage device 2200. The connection terminal 2250 may be constructed into various types depending on an interface scheme between the host device 2100 and the data storage device 2200. The connection terminal 2250 may be disposed on any one side of the data storage device 2200.

Figure 9:
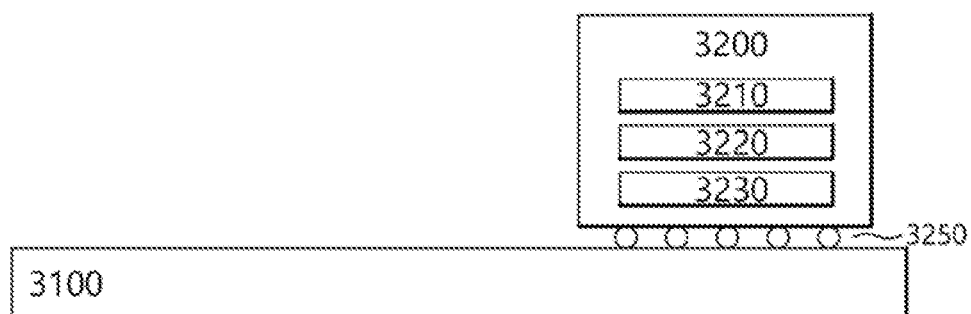
FIG. 9 is a diagram illustrating a data processing system including a data storage device in accordance with an embodiment of the present invention.

FIG. 9 is a diagram illustrating a data processing system 3000 including a data storage device 3200 in accordance with an embodiment of the present invention. Referring to FIG. 9, the data processing, system 3000 may also include a host device 3100 operatively coupled to the data storage device 3200.

The host device 3100 may be constructed in the form of a board such as a printed circuit board. Although not shown, the host device 3100 may include one, or more internal function blocks for performing the functions of a host device.

The data storage device 3200 may be constructed in the form of a surface-mounting type package. The data storage device 3200 may be mounted to the host device 3100 through a plurality of solder balls 3250. The data storage device 3200 may include a controller 3210, a buffer memory device 3220, and a nonvolatile memory device 3230.

The controller 3210 may control one or more operations of the data storage device 3200. The controller 3210 may be configured in the same manner as the controller 1210 shown in FIG. 6.

The buffer memory device 3220 may temporarily store data to be stored in the nonvolatile memory device 3230. Further, the buffer memory device 3220 may temporarily store the data read out from the nonvolatile memory device 3230. The data temporarily stored in the buffer memory device 3220 may be transmitted to the host device 3100 or the nonvolatile memory device 3230 according to control of the controller 3210.

The nonvolatile memory device 3230 may be used as the storage medium of the data storage device 3200.

Figure 10:
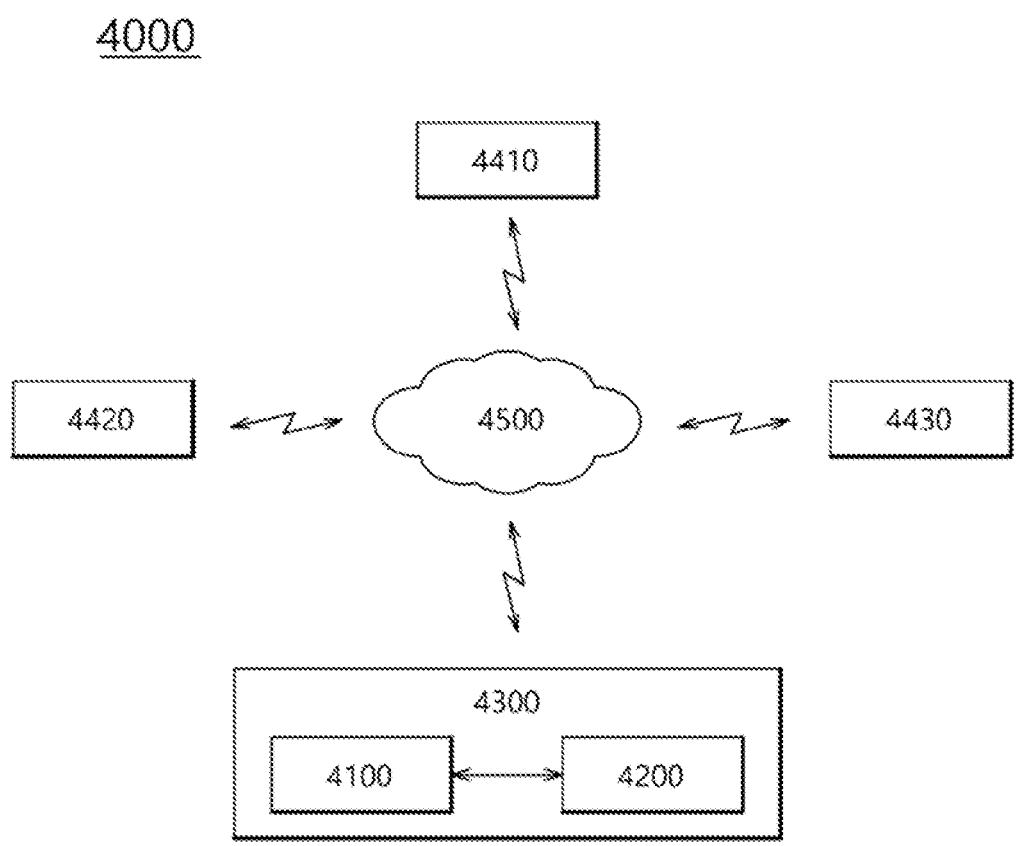
FIG. 10 is a diagram illustrating a network system including a data storage device in accordance with an embodiment of the present invention.

FIG. 10 is a diagram illustrating a network system including a data storage device in accordance with an embodiment of the present invention. Referring to FIG. 10, a network system 4000 may include a server system 4300 and client systems 4410 to 4430 which are coupled through a network 4500.

The server system 4300 may service data in response to requests from the plurality of client systems 4410 to 4430. For example, the server system 4300 may store the data provided from the plurality of client systems 4410 to 4430. For another example, the server system 4300 may provide data to the plurality of client systems 4410 to 4430.

The server system 4300 may include a host device 4100 and a data storage device 4200. The data storage device 4200 may be constructed by the data storage device 100 shown in FIG. 1, the data storage device 1200 shown in FIG. 6, the data storage device 2200 shown in FIG. 8 or the data storage device 3200 shown in FIG. 9.

Figure 11:
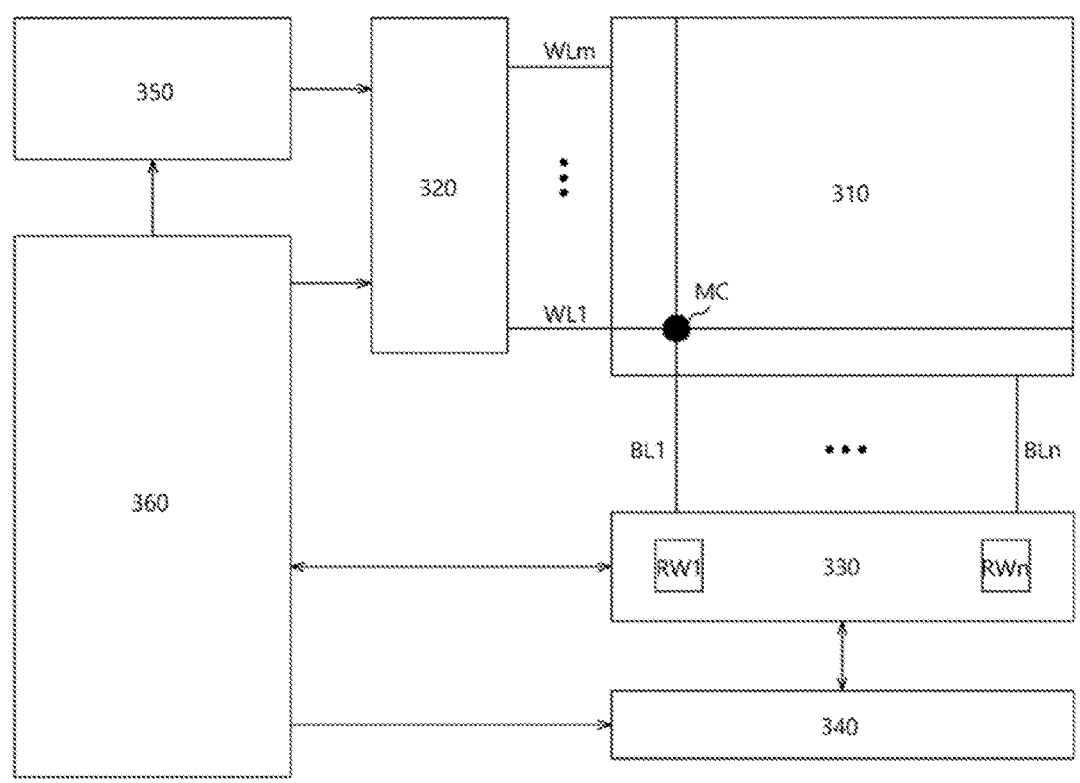
FIG. 11 is a block diagram illustrating a nonvolatile memory device included in a data storage device in accordance with an embodiment of the present invention.

FIG. 11 is a block diagram illustrating a nonvolatile memory device included in a data storage device in accordance with an embodiment of the present invention. Referring to FIG. 11, a nonvolatile memory device 300 may include a memory cell array 310, a row decoder 320, a column decoder 330, a data read/write block 340, a voltage generator 350, and a control logic 360.

The memory cell array 310 may include memory cells MC which are arranged at areas where word lines WL1 to WLm and bit lines BL1 to BLn intersect with each other.

The row decoder 320 may be coupled with the memory cell array 310 through the word lines WL1 to WLm. The row decoder 320 may operate according to control of the control logic 360. The row decoder 320 may decode an address provided from an external device (not shown). The row decoder 320 may select and drive the word lines WL1 to WLm, based on a decoding result. For instance, the row decoder 320 may provide a word line voltage provided from the voltage generator 350, to the word lines WL1 to WLm.

The data read/write block 340 may be coupled with the memory cell array 310 through the bit lines BL1 to BLn. The data read/write block 340 may include read/write circuits RW1 to RWn respectively corresponding to the bit lines BL1 to BLn. The data read/write block 340 may operate according to control of the control logic 360. The data read/write block 340 may operate as a write driver or a sense amplifier according to an operation mode. For example, the data read/write block 340 may operate as a write driver which stores data provided from the external device, in the memory cell array 310 in a write operation. For another example, the data read/write block 340 may operate as a sense amplifier which reads out data from the memory cell array 310 in a read operation.

The column decoder 330 may operate according to control of the control logic 360. The column decoder 330 may decode an address provided from the external device. The column decoder 330 may couple the read/write circuits RW1 to RWn of the data read/write block 340 respectively corresponding to the bit lines BL1 to BLn with data input/output lines (or data input/output buffers), based on a decoding result.

The voltage generator 350 may generate voltages to be, used in internal operations of the semiconductor memory device 300. The voltages generated by the voltage generator 350 may be applied to the memory cells of the memory cell array 310. For example, a program voltage generated in a program operation may be applied to a word line of memory cells for which the program operation is to be performed. For another example, an erase voltage generated in an erase operation may be applied to a well area of memory cells for which the erase operation is to be performed. For still another example, a read voltage generated in a read operation may be applied to a word line of memory cells for which the read operation is to be performed.

The control logic 360 may control one or more operations of the semiconductor memory device 300, based on control signals provided from the external device. For example, the control logic 360 may control operations of the semiconductor memory device 300 such as read, write and erase operations of the semiconductor memory device 300.

Although the present invention has been described in terms of various specific embodiments, it will be understood to those skilled in the art that the described embodiments are provided as examples only and are not intended to limit the scope of the present invention. Accordingly, the data storage device and the operating method thereof described herein should not be limited based on the described embodiments, and many other embodiments and variations thereof may be envisaged by those skilled in the art without departing from the scope and spirit of the present invention as defined in the following claims.

What is claimed is:

1. A data storage device comprising:
a nonvolatile memory device;
a control unit suitable for generating a descriptor describing one or more works for controlling the nonvolatile memory device;
a memory control unit suitable for performing a control operation and a data input operation for the nonvolatile memory device, based on the descriptor; and
a calibrator suitable for performing a calibration operation for a data signal to be provided to the nonvolatile memory device in response to an enable signal provided from the memory control unit,
wherein the memory control unit controls the calibrator so that the control operation and the calibration operation are performed in parallel, and wherein, the memory control unit selects one of calibration values obtained in a previous write operation and a current write operation based on a result of comparing a difference value between the calibration values obtained in the previous write operation and the current write operation and a calibration reference value, and applies the selected calibration value to the data signal.

2. The data storage device according to claim 1, wherein the memory control unit provides the enable signal to the calibrator at a start of the control operation.

3. The data storage device according to claim 1, wherein the control operation includes providing a write command and an address of data to be stored into the nonvolatile memory device.

4. The data storage device according to claim 1, further comprising:
a voltage detector suitable for detecting an operation voltage of at least one of the control unit, the memory control unit and the nonvolatile memory device, and providing a detected operation voltage to the memory control unit; and
a temperature detector suitable for detecting a temperature of the data storage device, and providing a detected temperature to the memory control unit.

5. The data storage device according to claim 4,
wherein the memory control unit manages a write count based on the descriptor, and
wherein the memory control unit determines whether the calibration operation is needed or not based on at least one among the detected voltage, the detected temperature and the write count.

6. The data storage device according to claim 5, wherein, when at least one of the detected voltage, the detected temperature and the write count goes out of an allowable voltage, temperature or count range, respectively, the memory control unit determines that the calibration operation is needed and provides the enable signal to the calibrator.

7. The data storage device according to claim 1, wherein the calibrator provides a current calibration value as a result of the calibration operation to the memory control unit.

8. The data storage device according to claim 7, wherein, in the case where an absolute value of a difference between the current calibration value and a previous calibration value is larger than a calibration reference value, the memory control unit applies the current calibration value to the signal to be provided to the nonvolatile memory device.

9. The data storage device according to claim 7, wherein, in the case where the absolute value of the difference between the current calibration value and the previous calibration value is equal to or smaller than the calibration reference value, the memory control unit applies the previous calibration value to the signal to be provided to the nonvolatile memory device.

10. The data storage device according to claim 1, wherein the signal to be provided to the nonvolatile memory device is a data signal which is transmitted from the memory control unit to the nonvolatile memory device while the data input operation is performed.

11. A method for performing a write operation of a data storage device including a nonvolatile memory device and a controller for controlling the nonvolatile memory device, the method comprising:
performing in parallel a control operation for controlling the nonvolatile memory device to perform the write operation and a calibration operation for a data signal to be provided to the nonvolatile memory device; and
applying a calibration value calculated as a result of the calibration operation to the data signal, and providing the data signal, to which the calibration value is applied, to the nonvolatile memory device,
wherein, based on a result of comparing a difference value between a calibration value obtained in a previous write operation and a calibration value obtained in a current write operation with a calibration reference value, the calibration value obtained one of the previous write operation and the current write operation is applied to the data signal.

12. The method according to claim 11, wherein the control operation and the calibration operation are started at the same time.

13. The method according to claim 11, wherein the control operation includes an operation of providing a write command and an address of data to be stored into the nonvolatile memory device.

14. The method according to claim 11, further comprising:
detecting an operation voltage of at least one of the nonvolatile memory device and the controller;
detecting a temperature of the data storage device; and
managing a write count of the nonvolatile memory device.

15. The method according to claim 14, wherein, in the case where the detected operation voltage goes out of an allowable voltage range, the detected temperature goes out of an allowable temperature range or the managed write count goes out of an allowable count range, the calibration operation is performed.

16. The method according to claim 11, wherein, in the case where the difference value is larger than the calibration reference value, the calibration value obtained in the current write operation is applied to the data signal.

17. The method according to claim 11, wherein, in the case where the difference value is equal to or smaller than the calibration reference value, the calibration value obtained in the previous write operation is applied to the data signal.

18. A data storage device comprising:
a nonvolatile memory device;
a calibrator suitable for generating a calibration value through a calibration operation to data to be stored into the nonvolatile memory device in response to an enable signal; and
a memory control unit suitable for selectively providing the enable signal during a control operation to the nonvolatile memory device, generating a calibrated data by applying to the data signal one of previous and current calibration values, and then providing the calibrated data to the nonvolatile memory device,
wherein, the memory control unit selects one of calibration values obtained in a previous write operation and a current write operation based on a result of comparing a difference value between the calibration values obtained in the previous write operation and the current write operation and a calibration reference value, and applies the selected calibration value to the data signal.

19. The data storage device according to claim 18, wherein the memory control unit provides the enable signal to the calibrator at a start of the control operation.

* * * * *